US010045457B1

(12) United States Patent
Miranda Gavillan et al.

(10) Patent No.: US 10,045,457 B1
(45) Date of Patent: Aug. 7, 2018

(54) SYSTEM FOR MAINTAINING THE ENVIRONMENT OF A SELF-COOLED DATA STORAGE LIBRARY

(71) Applicant: International Business Machines Corporation, Armonk, NY (US)

(72) Inventors: Jose G. Miranda Gavillan, Tucson, AZ (US); Brian G. Goodman, Tucson, AZ (US); Kenny Nian Gan Qiu, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/460,402

(22) Filed: Mar. 16, 2017

(51) Int. Cl.
| H05K 7/14 | (2006.01) |
| H05K 7/20 | (2006.01) |
| G11B 33/14 | (2006.01) |
| G11B 33/02 | (2006.01) |

(52) U.S. Cl.
CPC .......... *H05K 7/1488* (2013.01); *G11B 33/02* (2013.01); *G11B 33/144* (2013.01); *H05K 7/20736* (2013.01); *H05K 7/20781* (2013.01); *H05K 7/20818* (2013.01)

(58) Field of Classification Search
None
See application file for complete search history.

(56) References Cited

U.S. PATENT DOCUMENTS

| 4,838,911 A | 6/1989 | Robertson et al. |
| 5,278,708 A | 1/1994 | Apple et al. |
| 5,449,229 A | 9/1995 | Aschenbrenner et al. |
| 5,940,354 A * | 8/1999 | Inoue ..................... G11B 15/68 360/92.1 |
| 6,366,982 B1 | 4/2002 | Suzuki et al. |

(Continued)

FOREIGN PATENT DOCUMENTS

| CN | 102192631 A | 9/2011 |
| CN | 102407663 A | 4/2012 |

(Continued)

OTHER PUBLICATIONS

Hanaoka Y. et al., "Technologies for Realizing New ETERNUS LT270 High-End Tape Library System", FUJITSU Sci. Tech. J., 42.1, pp. 24-31, Jan. 2006.

(Continued)

*Primary Examiner* — Xanthia C Cunningham
(74) *Attorney, Agent, or Firm* — Fox Rothschild LLP

(57) ABSTRACT

A barrier system configured to at least partially surround at least one access opening that permits access to an interior of a data storage library. The barrier system includes at least one side surface configured to be coupled to at least one door along a first side surface location and to the data storage library along a second side surface location. The at least one side surface may be configured to be deployable to surround the at least one access opening and form a working space when the at least one door is in an open position, and is configurable to be collapsible when the at least one door is in a closed position. The at least one side surface may also be configured to resist environmental conditions external to the data storage library from intruding into the working space when the at least one side surface is deployed.

20 Claims, 12 Drawing Sheets

(56) References Cited

U.S. PATENT DOCUMENTS

| | | | |
|---|---|---|---|
| 6,467,285 B2 | 10/2002 | Felder et al. | |
| 6,478,524 B1 | 11/2002 | Malin | |
| 6,537,013 B2 | 3/2003 | Emberty et al. | |
| 6,563,771 B1 | 5/2003 | Debiez | |
| 6,661,596 B2 | 12/2003 | Chliwnyj et al. | |
| 6,676,026 B1 | 1/2004 | McKinley et al. | |
| 6,676,505 B2 | 1/2004 | Behl | |
| 6,854,275 B2 | 2/2005 | Evans | |
| 6,896,612 B1 | 5/2005 | Novotny | |
| 6,924,981 B2 | 8/2005 | Chu et al. | |
| 7,106,538 B2 | 9/2006 | Minemura et al. | |
| 7,277,247 B2 | 10/2007 | Hoshino | |
| 7,434,412 B1 | 10/2008 | Miyahira | |
| 7,474,497 B2 | 1/2009 | Jesionowski et al. | |
| 7,635,246 B2 | 12/2009 | Neeper et al. | |
| 7,656,602 B2 | 2/2010 | Ben et al. | |
| 7,656,660 B2 | 2/2010 | Hoeft et al. | |
| 7,746,634 B2* | 6/2010 | Hom | H05K 7/20736 165/104.33 |
| 7,751,188 B1 | 7/2010 | French et al. | |
| 7,961,419 B2 | 6/2011 | Suzuki et al. | |
| 8,051,671 B2 | 11/2011 | Vinson et al. | |
| 8,151,046 B2 | 4/2012 | Suzuki et al. | |
| 8,206,976 B2 | 6/2012 | Kobayashi et al. | |
| 8,210,914 B2 | 7/2012 | McMahan et al. | |
| 8,514,513 B2 | 8/2013 | Hori | |
| 8,544,289 B2 | 10/2013 | Johnson et al. | |
| 8,675,303 B2 | 3/2014 | Compton et al. | |
| 8,694,152 B2 | 4/2014 | Cyrulik et al. | |
| 8,789,384 B2 | 7/2014 | Eckberg et al. | |
| 8,849,784 B2 | 9/2014 | Alber et al. | |
| 8,857,208 B2 | 10/2014 | Malin | |
| 8,939,524 B2 | 1/2015 | Gasser | |
| 8,974,274 B2 | 3/2015 | Carlson | |
| 9,025,275 B1 | 5/2015 | Manes et al. | |
| 9,069,534 B2 | 6/2015 | Rogers | |
| 9,110,641 B2 | 8/2015 | Wu | |
| 9,155,230 B2 | 10/2015 | Eriksen | |
| 9,190,112 B1 | 11/2015 | Bayang et al. | |
| 9,240,209 B1 | 1/2016 | Crawford et al. | |
| 9,255,936 B2 | 2/2016 | Hunt et al. | |
| 9,291,408 B2 | 3/2016 | Iyengar et al. | |
| 9,321,136 B2 | 4/2016 | Eckberg et al. | |
| 9,361,921 B2 | 6/2016 | Herget | |
| 9,368,148 B2 | 6/2016 | Starr et al. | |
| 9,433,122 B2 | 8/2016 | Ohba et al. | |
| 2002/0098064 A1 | 7/2002 | Ostwald et al. | |
| 2003/0039056 A1 | 2/2003 | Satoh | |
| 2003/0197619 A1 | 10/2003 | Lawrence et al. | |
| 2004/0080244 A1* | 4/2004 | Lowther, Jr. | A47B 45/00 312/205 |
| 2004/0145468 A1 | 7/2004 | La et al. | |
| 2004/0153386 A1 | 8/2004 | Eckerdt | |
| 2004/0165358 A1 | 8/2004 | Regimbal et al. | |
| 2005/0185323 A1 | 8/2005 | Brace et al. | |
| 2005/0270727 A1 | 12/2005 | Shih | |
| 2006/0177922 A1 | 8/2006 | Shamah et al. | |
| 2006/0250578 A1 | 11/2006 | Pohl et al. | |
| 2007/0250410 A1 | 10/2007 | Brignone et al. | |
| 2008/0151491 A1 | 6/2008 | Baldwin et al. | |
| 2009/0046427 A1 | 2/2009 | Noteboom et al. | |
| 2009/0266511 A1 | 10/2009 | Yang | |
| 2010/0188810 A1 | 7/2010 | Andersen et al. | |
| 2010/0254241 A1 | 10/2010 | Aoki | |
| 2011/0108207 A1 | 5/2011 | Mainers et al. | |
| 2011/0231007 A1 | 9/2011 | Biehle et al. | |
| 2013/0031928 A1 | 2/2013 | Kim | |
| 2013/0088833 A1 | 4/2013 | Cox et al. | |
| 2013/0128455 A1 | 5/2013 | Koblenz et al. | |
| 2014/0059946 A1 | 3/2014 | Gardner et al. | |
| 2014/0206271 A1 | 7/2014 | Ignacio | |
| 2014/0238639 A1 | 8/2014 | Ambriz et al. | |
| 2014/0277765 A1 | 9/2014 | Karimi et al. | |
| 2014/0293471 A1 | 10/2014 | Sakuma | |
| 2015/0036293 A1 | 2/2015 | Martini | |
| 2015/0088319 A1 | 3/2015 | Dasari et al. | |
| 2015/0167996 A1 | 6/2015 | Fadell et al. | |
| 2015/0179210 A1 | 6/2015 | Ostwald et al. | |
| 2015/0203297 A1 | 7/2015 | Manning et al. | |
| 2015/0294525 A1* | 10/2015 | Broom | G07F 11/62 221/1 |
| 2016/0094898 A1 | 3/2016 | Primm et al. | |
| 2016/0107312 A1 | 4/2016 | Morrill et al. | |
| 2016/0112245 A1 | 4/2016 | Mankovskii | |
| 2016/0117126 A1 | 4/2016 | De Spiegeleer et al. | |
| 2016/0240061 A1 | 8/2016 | Li et al. | |
| 2016/0302332 A1* | 10/2016 | Anderson | H05K 9/0015 |
| 2017/0154483 A1 | 6/2017 | Cordiner et al. | |

FOREIGN PATENT DOCUMENTS

| | | |
|---|---|---|
| CN | 102881313 A | 1/2013 |
| CN | 204361533 U | 5/2015 |
| JP | 2001307474 A | 11/2001 |
| JP | 2009087518 A | 4/2009 |
| JP | 2011191207 A | 9/2011 |
| WO | 2007099542 A2 | 9/2007 |
| WO | 2008014578 A1 | 2/2008 |
| WO | 2009134610 A2 | 11/2009 |
| WO | 2010067443 A1 | 6/2010 |

OTHER PUBLICATIONS

McCormick-Goodhart M. et al, "The Design and Operation of a Passive Humidity-Controlled Cold Storage Vault Using Conventional Freezer Technology and Moisture-Sealed Cabinets", IS&T's 2004 Archiving Conference, Apr. 20-23, 2005, San Antonio, Texas.

Frachtenberg E. et al., "Thermal Design in the Open Compute Datacenter", Thermal and Thermomechanical Phenomena in Electronic Systems (ITherm), 13th IEEE I22012.

Oga, S. et al., "Indirect External Air Cooling Type Energy-Saving Hybrid Air Conditioner for Data Centers, "F-COOL NEO"", Fuji Electric Review, vol. 60, No. 1, Mar. 30, 2014, pp. 59-64.

Lee, S. et al., "Thermoelectric-based Sustainable Self-Cooling for Fine-Grained Processor Hot Spots", 15th IEEE ITHERM Conference, May 31-Jun. 3, 2016, pp. 847-856.

Disclosed Anonymously, ip.com, "Method for a Direct Air Free Cooling with a real time hygrometry regulation for Data Center", IPCOM000200312D, Oct. 5, 2010, pp. 1-3.

Rasmussen N., "Cooling Options for Rack Equipment with Side-to-Side Airflow", www.apc.com, 2004.

Ouchi M. et al., "Thermal Management Systems for Data Centers with Liquid Cooling Technique of CPU", ITherm IEEE 13th Intersociety Conference, May 30-Jun. 1, 2012, pp. 790-798.

Authors: IBM, "Energy Efficient Cooling System for Data Center", IPCOM000182040D, Apr. 23, 2009, pp. 1-4.

Ernest S. Gale et al., U.S. Appl. No. 15/460,389, filed Mar. 16, 2017.

Ernest S. Gale et al., U.S. Appl. No. 15/460,397, filed Mar. 16, 2017.

Ernest S. Gale et al., U.S. Appl. No. 15/460,403, filed Mar. 16, 2017.

Ernest S. Gale et al., U.S. Appl. No. 15/460,420, filed Mar. 16, 2017.

Jose G. Miranda Gavillan et al., U.S. Appl. No. 15/460,345, filed Mar. 16, 2017.

Jose G. Miranda Gavillan et al., U.S. Appl. No. 15/460,357, filed Mar. 16, 2017.

Jose G. Miranda Gavillan et al., U.S. Appl. No. 15/460,379, filed Mar. 16, 2017.

Jose G. Miranda Gavillan et al., U.S. Appl. No. 15/460,402, filed Mar. 16, 2017.

Jose G. Miranda Gavillan et al., U.S. Appl. No. 15/460,423, filed Mar. 16, 2017.

Jose G. Miranda Gavillan et al., U.S. Appl. No. 15/460,441, filed Mar. 16, 2017.

Jose G. Miranda Gavillan et al., U.S. Appl. No. 15/460,456, filed Mar. 16, 2017.

Jose G. Miranda Gavillan et al., U.S. Appl. No. 15/460,472, filed Mar. 16, 2017.

Jose G. Miranda Gavillan et al., U.S. Appl. No. 15/460,479, filed Mar. 16, 2017.

(56) References Cited

OTHER PUBLICATIONS

Jose G. Miranda Gavillan et al., U.S. Appl. No. 15/460,429, filed Mar. 16, 2017.
Jose G. Miranda Gavillan et al., U.S. Appl. No. 15/460,439, filed Mar. 16, 2017.
Ernest S. Gale et al., U.S. Appl. No. 15/460,497, filed Mar. 16, 2017.
List of IBM Patents or Applications Treated as Related.

* cited by examiner

SYSTEM FOR MAINTAINING THE ENVIRONMENT OF A SELF-COOLED DATA STORAGE LIBRARY

BACKGROUND

The present invention relates to a data storage library for the storage and data transfer of data storage media, and more specifically, to a data storage library having one or more library frames having an extension or barrier substantially surrounding at least an access opening of the one or more library frames.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, COMPACTFLASH™, SMARTMEDIA™, MEMORY STICK™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more robotic accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier.

SUMMARY

In accordance with an aspect of the disclosure, a barrier configured to at least partially surround at least one access opening that permits access to an interior of a data storage library through at least one access door is disclosed. The barrier includes at least one side surface configured to be coupled to the at least one door at least partially along a first side surface location and to the data storage library along a second side surface location, and at least one top surface configured to be coupled to the at least one door at least partially along a first top surface location and to the data storage library along a second top surface location. The at least one side surface and the at least one top surface of the barrier system may be configured to be deployable to surround the at least one access opening and form a working space when the at least one door is in an open position, and are configurable to be collapsible when the at least one door is in a closed position. The at least one side surface and the at least one top surface may be configured to resist environmental conditions external to the data storage library from intruding into the working space when the at least one side surface and the at least one top surface are deployed.

In accordance with another aspect of the disclosure, a barrier configured to at least partially surround at least one access opening that permits access to an interior of a data storage library, the at least one access opening having at least one door, is disclosed. The barrier includes at least one side surface configured to be coupled to the at least one door at a first side surface location and to the data storage library at a second side surface location, wherein a barrier storage mechanism is configured to be coupled to at least one of the data storage library and the at least one door at a location adjacent the at least one access opening and opposite a hinged connection location of the at least one door. The at least one side surface of the barrier system is configured to automatically deploy when the at least one door is opened and is configured to automatically retract when the at least one door is closed, and the at least one side surface of the barrier system is configured to resist environmental conditions from exterior the data storage library from intruding into the interior of data storage library when the at least one side surface is deployed.

According to another aspect of the disclosure, a system is disclosed which includes a data storage library, wherein the data storage library is configured to read and receive media associated with one or more data storage cartridges, and further wherein the data storage library comprises at least one access opening for servicing an interior of the data storage library having at least one access door for access through the at least one access opening. The system also includes at least one environmental conditioning unit configured to control at least one environmental condition within the data storage library, as well as at least one barrier configured to automatically deploy and surround the at least one access opening of the data storage library when the at least one access door is opened, and further wherein the barrier is configured to resist environmental conditions external to the data storage library from intruding into the interior of the data storage library when the at least one access door is opened.

DETAILED DESCRIPTION

Figure 1A:
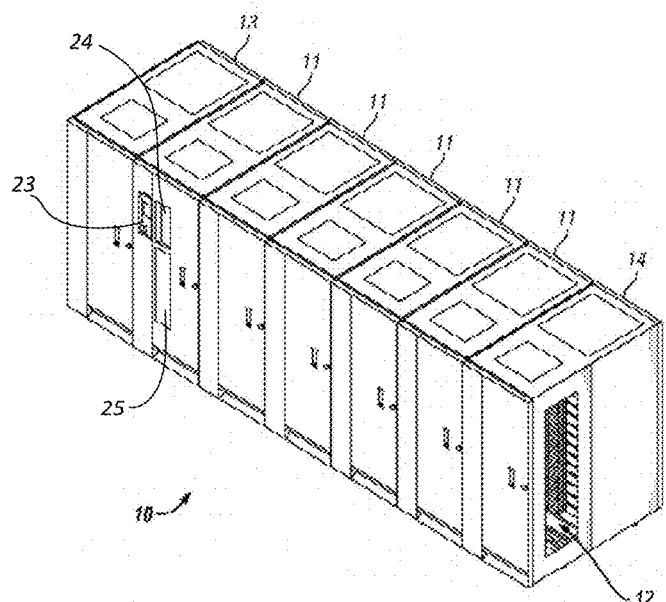
FIG. 1A is a perspective view of an automated data storage library according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape is more susceptible to degradation when exposed to these unfavorable conditions. Therefore, this option is not available for magnetic tape libraries.

In an effort to control the environment within magnetic tape libraries so as to provide suitable working conditions for magnetic tape media, data storage drives, etc., air conditioning units may be incorporated into the data storage libraries themselves. While these air conditioning units effectively control the temperature and humidity within the data storage libraries, the environmental conditions of the area surrounding the data storage libraries remain largely unchanged, with conditions often being higher in both temperature and humidity. While this may allow a datacenter to operate at reduced costs, it may also result in a marked temperature differential between the interior and exterior environments of the data storage libraries. Such a temperature differential may prove problematic during service of the data storage library and/or replacement of data storage library components such as data storage cartridges, data storage drives, etc., as condensation may develop on replacement cartridges and other service parts during installation and/or removal from the data storage library. Condensation accumulation on such sensitive componentry may cause component failure and/or data loss. Herein, service, service access or service procedure of the data storage library refers to maintenance, repair, adding data storage cartridges, removing data storage cartridges, or any other reason that access to the interior of the data storage library may be required.

Figure 1B:
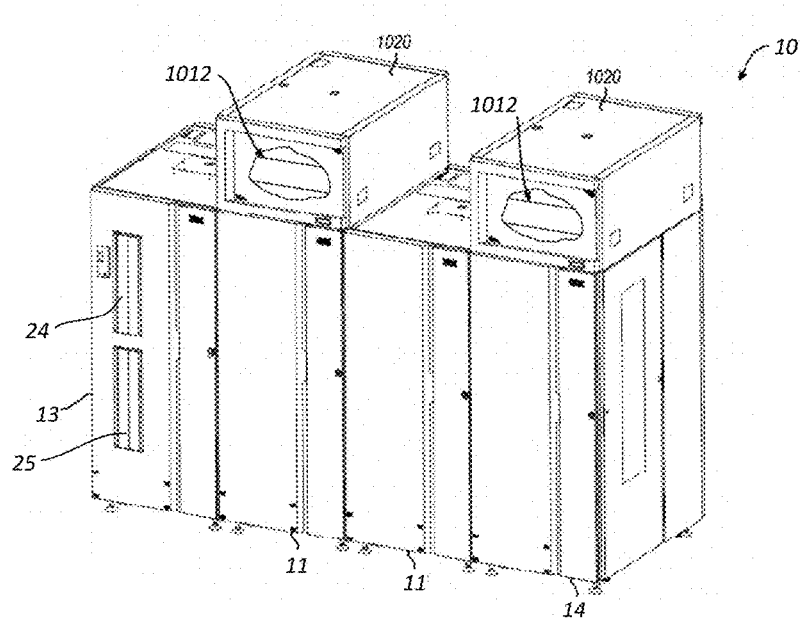
FIG. 1B is a perspective view of another embodiment of an automated data storage library.
Figure 2:
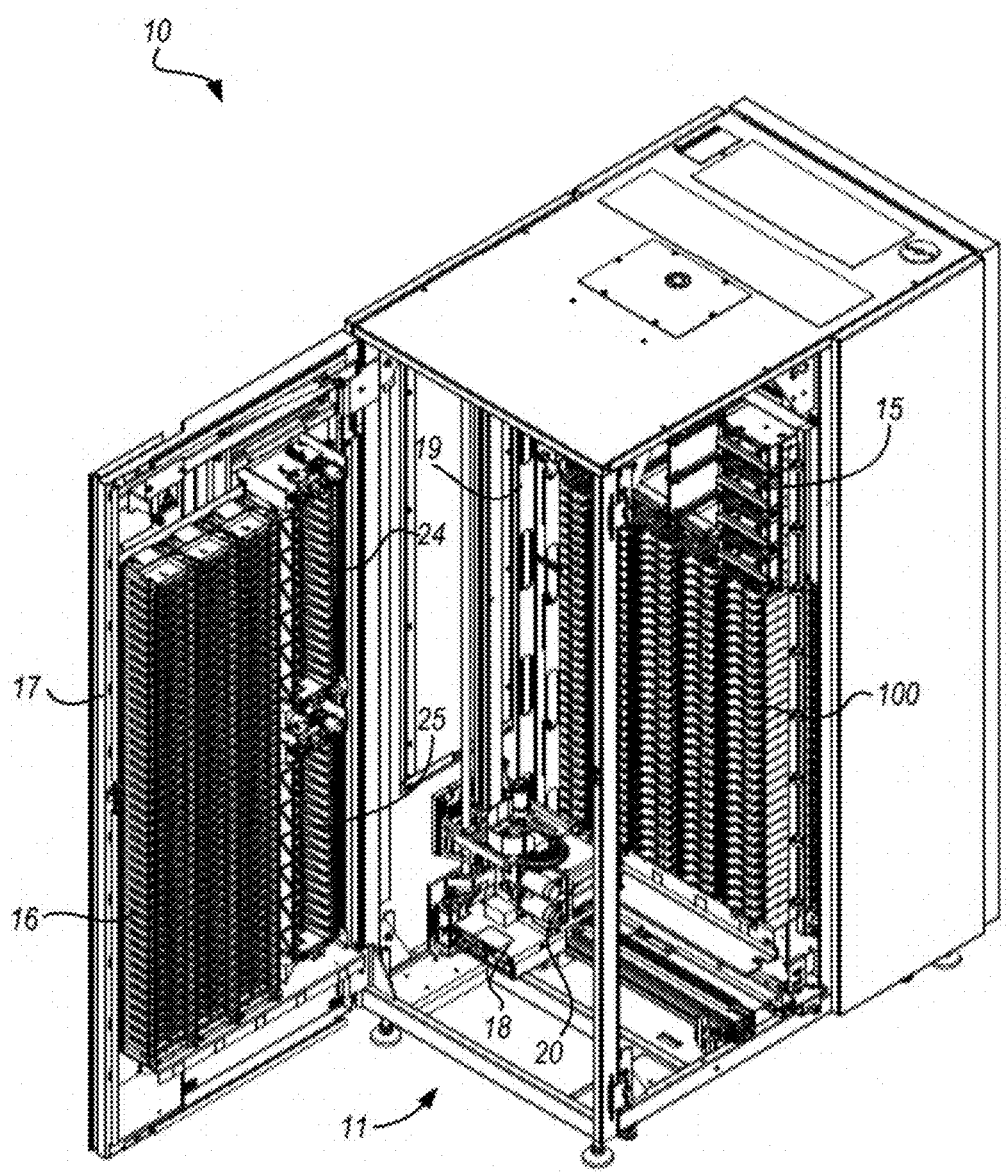
FIG. 2 is a perspective view of the interior of a storage frame from the data storage library of FIGS. 1A & 1B.

FIGS. 1A & 1B and FIG. 2 illustrate an example of a data storage system, e.g., an automated data storage library 10 which stores and retrieves data storage cartridges, containing data storage media (not shown), from multi-cartridge deep slot storage cells 100 and single cartridge storage slots 16. Examples of an automated data storage library which has a similar configuration as that depicted in FIG. 1A and FIG. 2, and may be implemented with some of the various approaches herein may include IBM TS4500 Tape Library or the IBM TS3500 Tape Library.

The library 10 in the embodiment of FIG. 1A comprises a left hand service bay 13, one or more storage frames 11, and right hand service bay 14. The library 10 of FIG. 1B comprises a left handed service bay 13, one or more storage frames 11, a right handed service bay 14 and optional environmental conditioning units 1012 which may control the temperature, humidity and/or other environmental conditions in the interior of the library 10. While two environmental conditioning units are shown in FIG. 1B, it will be appreciated that more or less environmental conditioning units 1012 may be associated with the library, and in circumstances the library may have no environmental conditioning units. As will be discussed in further detail below, a frame may comprise an expansion component of the library. Thus, storage frames may be added or removed to expand or reduce the size and/or functionality of the library. According to different approaches, frames may include additional storage slots, deep storage slot cells, drives, import/export stations, accessors, operator panels, controller cards, communication cards, etc. Moreover, an accessor aisle 12 preferably extends between the storage frames and bays of the embodiments in FIGS. 1A & 1B thereby allowing an accessor to move between frames. A moveable and/or deployable panel 21 may be displaced to cover and/or block (as well uncover and/or unblock) aisle 12 from communicating with the exterior of the data storage library. Panel 21 may be moved and/or removed to permit access to the interior of the service bays 13, 14. Panel 21 may be a window to permit visibility into the library 10.

FIG. 2 shows an exemplary embodiment of a storage frame 11, which may act as the base frame of the library 10. The storage frame 11 illustrated in FIG. 2 may have only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front door 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. The arrangement and positioning of the storage slots 16 and the deep slot cells 100 may be different than illustrated in FIG. 2.

With continued reference to FIG. 2, the storage frame 11 of the library 10 also includes at least one data storage drive 15, e.g., for reading and/or writing data with respect to the data storage media in the data storage cartridges. Additionally, a first accessor 18 may be used to transport data storage cartridges containing data storage media between the plurality of storage slots 16, the multi-cartridge deep slot cells 100, and/or the data storage drive(s) 15. According to various approaches, the data storage drives 15 may be optical disk drives, magnetic tape drives, or other types of data storage drives that are used to read and/or write data with respect to the data storage media.

As illustrated, the storage frame 11 may optionally include an operator panel or other user interface, such as a web-based interface, which allows a user to interact with the library 10. Optionally, the library 10 may have an associated software application having a user interface, which also allows a user to interact with the library 10. The software application may be executable on a computing device, a remote server, a cloud or a mobile device.

Figure 3:
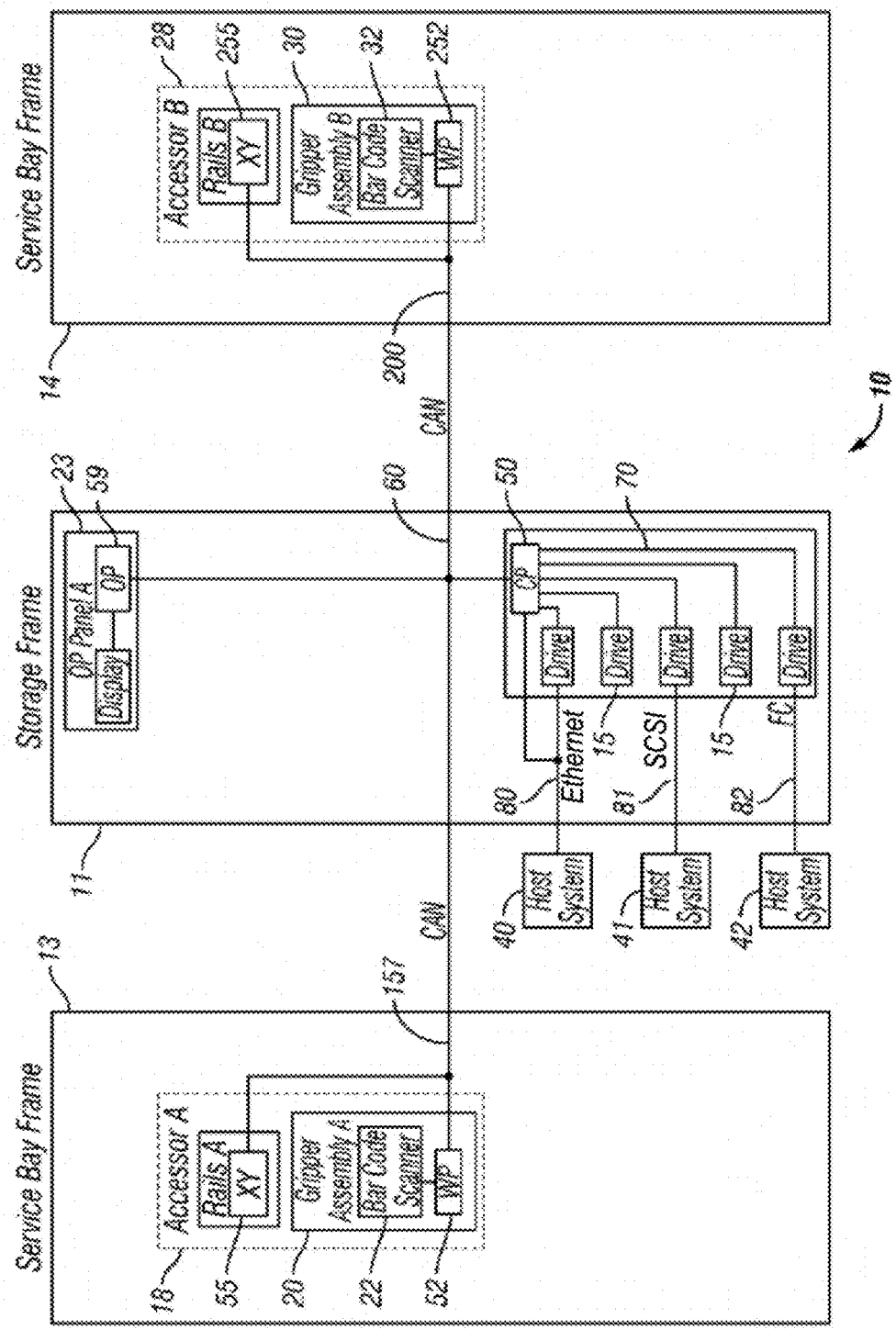
FIG. 3 is a schematic diagram of an automated data storage library according to one embodiment.

Referring now to FIG. 3, the automated data storage library 10 as described in reference to FIGS. 1A & 1B and FIG. 2, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements of the accessor, gripper, controllers, and other components, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

With continued reference to FIG. 3, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16, the deep slot cells 100, and the data storage drives 15. The commands are typically logical commands identifying the data storage cartridges or data storage cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessors 18, 28 and/or gripper assemblies 20, 30. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

As illustrated in FIG. 3, the communication processor node 50 is coupled to each of the data storage drives 15 of a storage frame 11, via lines 70, and may communicate with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, lines 80 and 81 are intended to be Ethernet and a SCSI bus, respectively, and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus, the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, storage cells 100, data storage drives 15, networks 60, etc.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
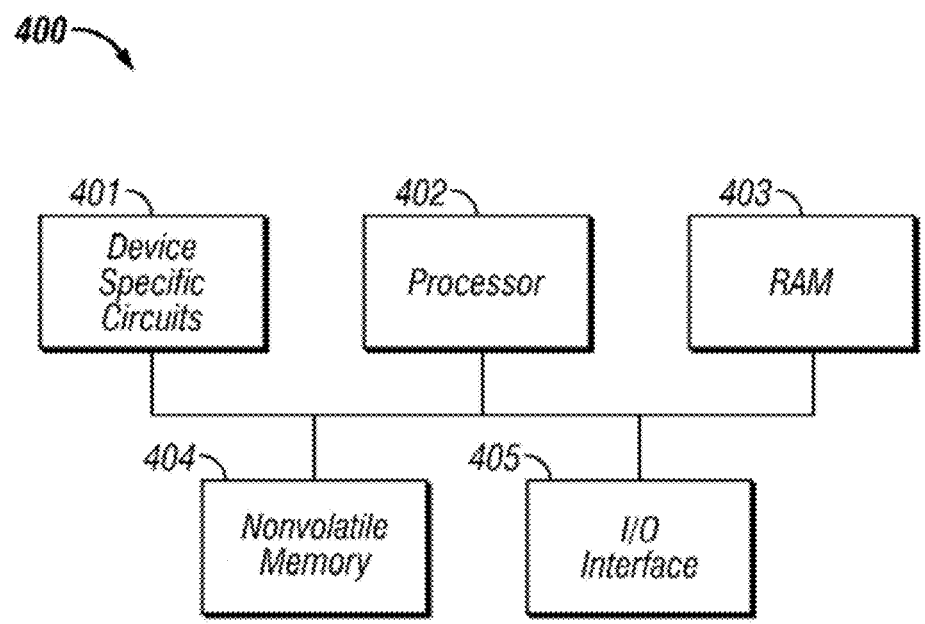
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data containing programming instructions that can be executed to cause the processor 402 to perform certain functions.

In some embodiments, the I/O interface 405 may include a communication interface that allows the processor 402 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The controller 400 may communicate with an external device via the communication interface 405 in any communication protocols such as Automation/Drive Interface (ADI).

The device specific circuits 401 provide additional hardware to enable the controller 400 to perform unique functions including, but not limited to, motor control of an accessor cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers, or multiple cores in a processor chip.

Figure 5:
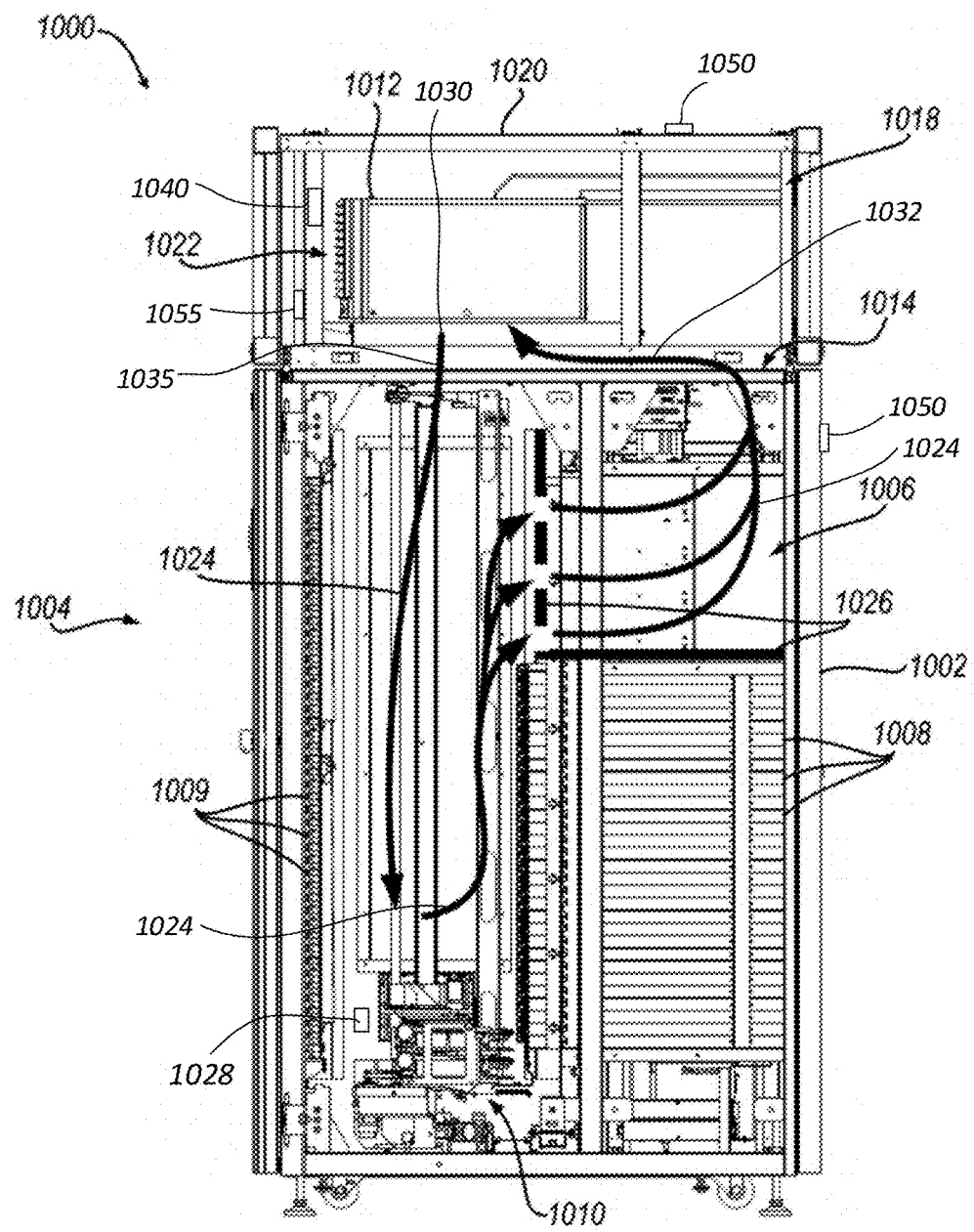
FIG. 5 is a partial side view of a system for storing magnetic recording media, in accordance with one embodiment.

Referring now to FIG. 5, a system 1000 includes a frame 1002 of an automated data storage library 1004. As described above, automated libraries are typically used to store cartridges and drives in large arrays to store large amounts of data. Thus, an interior of frame 1002 is illustrated as a tape library in one embodiment, and is depicted as including one or more tape drives 1006, an area for storing tape cartridges (e.g., multi-cartridge deep slot cells 1008 and single cartridge storage slots 1009), and a robotic accessor 1010, among other components which would be apparent to one skilled in the art upon reading the present description (e.g., see FIG. 2 above).

System 1000 further includes an optional environmental conditioning unit 1012 associated with the frame 1002. The environmental conditioning unit 1012 may be integrated with and coupled to frame 1002. For the purposes of the present disclosure, it is to be understood that an environmental conditioning unit may be any device which conditions the air and/or the surrounding environment and is able to change the environmental conditions. The environmental conditions may include (but are not limited to) temperature, humidity, pressure, etc. In one embodiment, the environmental conditioning unit may be an air-conditioning unit. In other embodiments, the environmental conditioning unit may be a thermo-electric heater, a thermo-electric cooler, an electric heater, a liquid heater, a liquid cooler, a heat pump, an evaporative cooler, an ionizer, a de-ionizer, a humidifier, a dehumidifier, one or more fans, or any combination thereof. An environmental conditioning unit in accordance with one embodiment of the present disclosure may increase or decrease the temperature, humidity, pressure, etc. The environmental conditioning unit 1012 may be coupled to an upper surface 1014 (e.g., the roof) of the frame 1002 as shown in FIG. 1B and FIG. 5. The environmental conditioning unit 1012 preferably operates without negatively affecting the operating conditions in the frame 1002. Alternatively, an environmental conditioning unit may be functionally associated with the frame 1002 by positioning the environmental conditioning unit elsewhere and using ducts to route the air to the interior of the frame 1002, coupling the environmental conditioning unit to a side of the frame 1002, coupling the environmental conditioning unit to a bottom of the frame 1002 (underneath the frame 1002), etc., depending on the desired approach.

The environmental conditioning unit 1012 is preferably configured such that it may adjust, change and/or regulate the relative conditions (e.g., temperature, humidity, contaminant presence via filtering, etc.) inside the frame 1002. Thus, according to different approaches, the environmental conditioning unit may be able to reduce the temperature of the interior of the frame 1002 and/or reduce the relative humidity of the interior of the frame 1002, depending on the type of environmental conditioning unit 1012 employed. The environmental conditioning unit 1012 is preferably configured to turn on and off as desired to maintain a selected temperature and/or humidity in the interior of the frame 1002. Alternatively, the environmental conditioning unit may have a fan and the fan can be left always on to keep air circulating within the interior of the frame. In one embodiment, the environmental conditioning unit may be an air conditioning unit and the fan may be continuously on and the condenser may turn on and off to maintain a selected temperature and/or humidity in the interior of the frame 1002.

As would be appreciated by one skilled in the art, the environmental conditioning unit 1012 may be an air conditioning unit and may be able to adjust the relative temperature and/or humidity of the interior of the frame 1002 in a conventional manner. Cold air may flow into the interior of the frame 1002 via an inlet air duct 1030 which may connect the environmental conditioning unit 1012 to the interior of the frame 1002, and form an inlet 1035 in the upper surface 1014 of the frame 1002. Specifically, an inlet air duct 1030 may direct the air cooled by the environmental conditioning unit 1012 into the interior of the frame 1002, e.g., where the majority of the data storage media may be stored. As a result, air flow is created from the environmental conditioning unit 1012 to the interior of the frame 1002, as indicated by arrows 1024. This air flow may be induced by a fan included in the air conditioning unit 1012 and/or by using the fans in the one or more tape drives 1006 in the frame 1002. Although the air flow is preferably directed from the environmental conditioning unit 1012 to the interior of the frame 1002, and from the interior of the frame 1002 back to the environmental conditioning unit 1012, the particular path that the air flow is shown as extending along in the present embodiment by arrows 1024 is in no way intended to limit the disclosure or the invention.

With continued reference to FIG. 5, system 1000 may include an enclosure 1020 for the environmental conditioning unit 1012. An additional fan 1040 may be included in the enclosure 1020 for passing ambient air over external components of the environmental conditioning unit 1012 to further promote heating, cooling and/or conditioning of the air. Moreover, the enclosure 1020 may include an opening, a baffle or baffles, etc. to direct ambient air exterior to the library 1004 toward an inlet 1022 of the environmental conditioning unit 1012.

In one embodiment, any vents, voids, seams, etc. in the frame 1002 of the library 1004, other than inlet 1035 and an outlet 1032 in an upper surface 1014 of the frame 1002, are preferably sealed such that air from outside the frame 1002 is restricted from entering the interior thereof. The frame 1002 may be sealed using any processes which would be apparent to one skilled in the art upon reading the present description, e.g., including but not limited to inserting foam, implementing insulating seals, etc. New frames may be built without any vents, voids, seams, etc. The housing and panels enclosing the frame 1002 may also be insulated to prevent or inhibit unconditioned air from entering the frame 1002.

The frame 1002 may also include one or more environmental sensors 1050 exterior to the library 1004 and may also include one or more sensors 1055 exterior to the library 1004 but inside the enclosure 1020 for the environmental conditioning unit 1012. In one embodiment the sensors 1055 may be located in front of inlet 1022 of the environmental conditioning unit 1012. The environmental sensors 1050, 1055 may be any sensor appropriate for determining the environmental conditions at the sensor location, such as one or more temperature sensors, one or more humidity sensors, one or more pressure sensors, etc. The one or more environmental sensors 1050, 1055 may be in communication with a library controller, such as library controller 400 shown and described with respect to FIG. 4. The one or more signals provided by the environmental sensors 1050, 1055 may be utilized to control the output and operation of the environmental conditioning unit 1012. Although the embodiment illustrated in FIG. 5 includes a single frame 1002 and a single environmental conditioning unit 1012, other embodiments may include additional frames and/or environmental conditioning units.

System 1000 illustrated in FIG. 5 may further comprise one or more environmental sensors 1028 disposed within the interior of the library 1002. The environmental sensor(s) may be any appropriate sensor for determining the environmental conditions within the frame 1002, such as one or more temperature sensors, one or more humidity sensors, one or more pressure sensors, etc. The one or more environmental sensors 1028 may be in communication with a library controller, such as controller 400 shown and described with respect to FIG. 4. As such, the signal provided by the one or more environmental sensors 1028 may be utilized to control the output and operation of the environmental conditioning unit 1012.

Although the embodiment illustrated in FIG. 5 includes a single frame 1002 and a single environmental conditioning unit 1012, other embodiments may include additional frames and/or environmental conditioning units.

Figure 6:
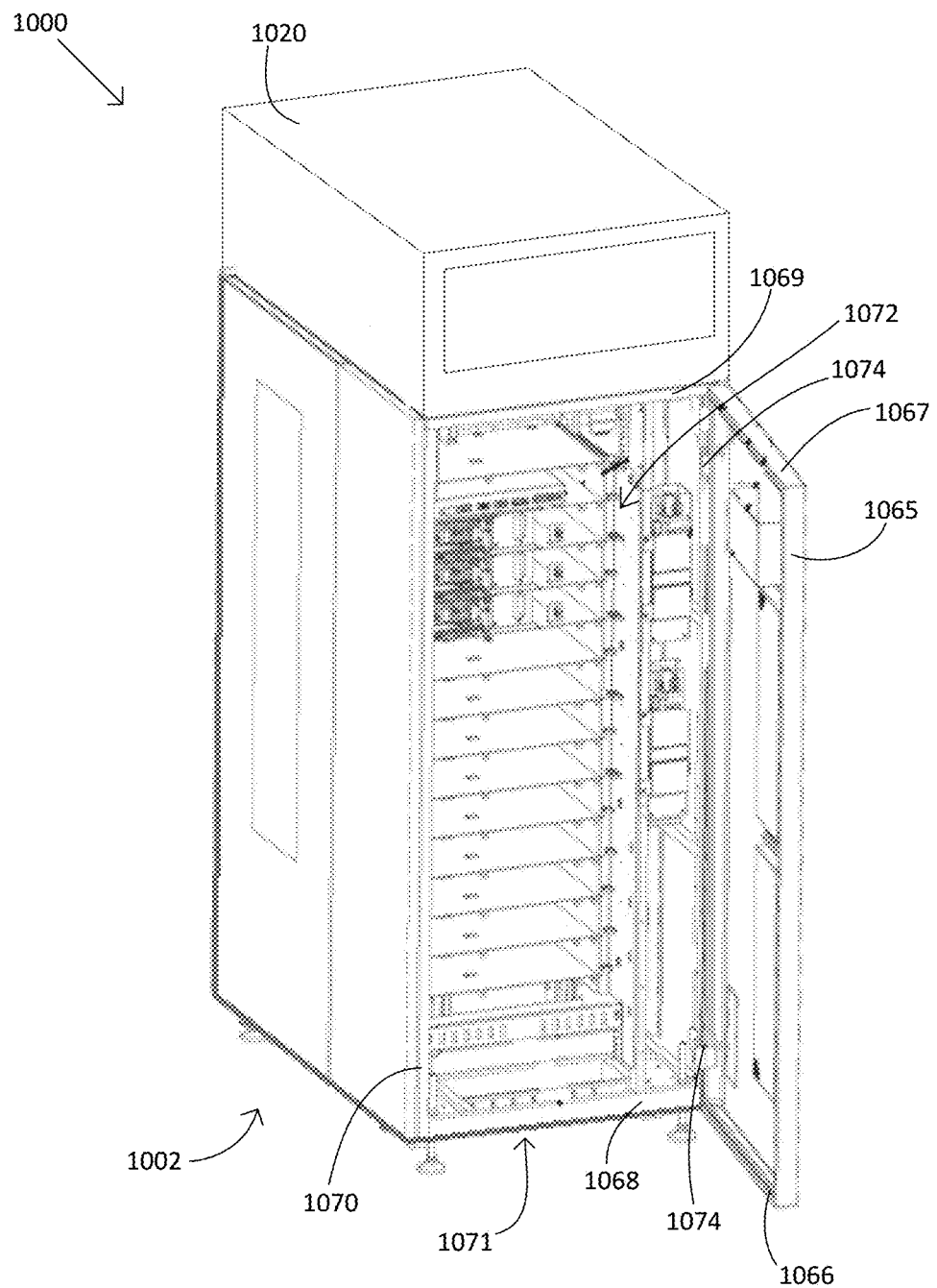
FIG. 6 is a perspective rear view of a data storage library in accordance with one aspect.

Referring now to FIG. 6, a rear perspective view of frame 1002 is illustrated. The rear portion of frame 1002 comprises a hinged rear door 1065, wherein door 1065 allows for access to various library components within an interior portion 1072 of frame 1002, such as, e.g., power supplies, data storage drives, library controller cards, cables, etc. While not shown, it is to be understood that frame 1002 may additionally or alternatively include a front door or panel that allows for access to various library components therein, such as, e.g., storage slots, robotic accessors, etc., and/or one or more side doors or access panels which allow for service access. Door 1065 includes a bottom door frame portion 1066 and a top door frame portion 1067, and door 1065 is coupled to the frame 1002 via one or more hinges 1074. However, door 1065 may be coupled to frame 1002 via any appropriate connecting means. When closed, respective surfaces of door 1065 may rest along a bottom frame portion 1068, top frame portion 1069, and side frame portion 1070 such that the interior portion 1072 is no longer accessible and substantially protected from the outer environment. A gap 1071 may be present between the bottom frame portion 1066 and the floor upon which the frame 1002 sits, allowing for adjustment, airflow, and sufficient clearance for frame 1002.

While a data storage library having an associated and/or integrated environmental conditioning unit advantageously controls the environmental conditions within the library, some challenges may exist when components within such a data storage library need to be serviced or replaced. As noted above, many data centers are now maintained at higher temperatures and higher humidity levels to reduce the costs relating to cooling the environment where the data storage library is located, e.g., the data center. For this reason, environmental conditions of the data center may be substantially different from those within a data storage library having an associated environmental conditioning unit which controls the environmental conditions within the data storage library. As such, opening an access door to the data storage library may introduce an influx of air from the data center into the conditioned environment of the data storage library, potentially causing and/or resulting in undesirable conditions (e.g., the formation and/or accumulation of condensation on various surfaces) within the data storage library. For example, moisture accumulation on surfaces of sensitive components such as data storage cartridges and data storage drives is undesirable, as condensation potentially may lead to equipment damage, up to and including failure of the components and/or data loss.

Thus, in accordance with aspects of the disclosure, an apparatus, for example a movable barrier, is provided that may be configured, arranged, and transformable to at least partially surround an access opening of a data storage library. The data storage library may comprise an associated environmental conditioning unit (e.g., an air conditioning unit). The barrier may permit an access door or other access panel of the data storage library to be opened in a manner that inhibits, impedes, resists, and/or prevents an influx of air from the surrounding data center into the interior of the data storage library. Thus, the barrier may resist, impede, inhibit, and/or prevent contaminants (e.g., dust, dirt, smoke, ash, etc.), thermal shock and/or condensation formation and/or accumulation on sensitive componentry during service and/or maintenance procedures due to wide variations in environmental conditions between the interior of the data storage library and the exterior of the data storage library, e.g. the data center.

Figure 7:
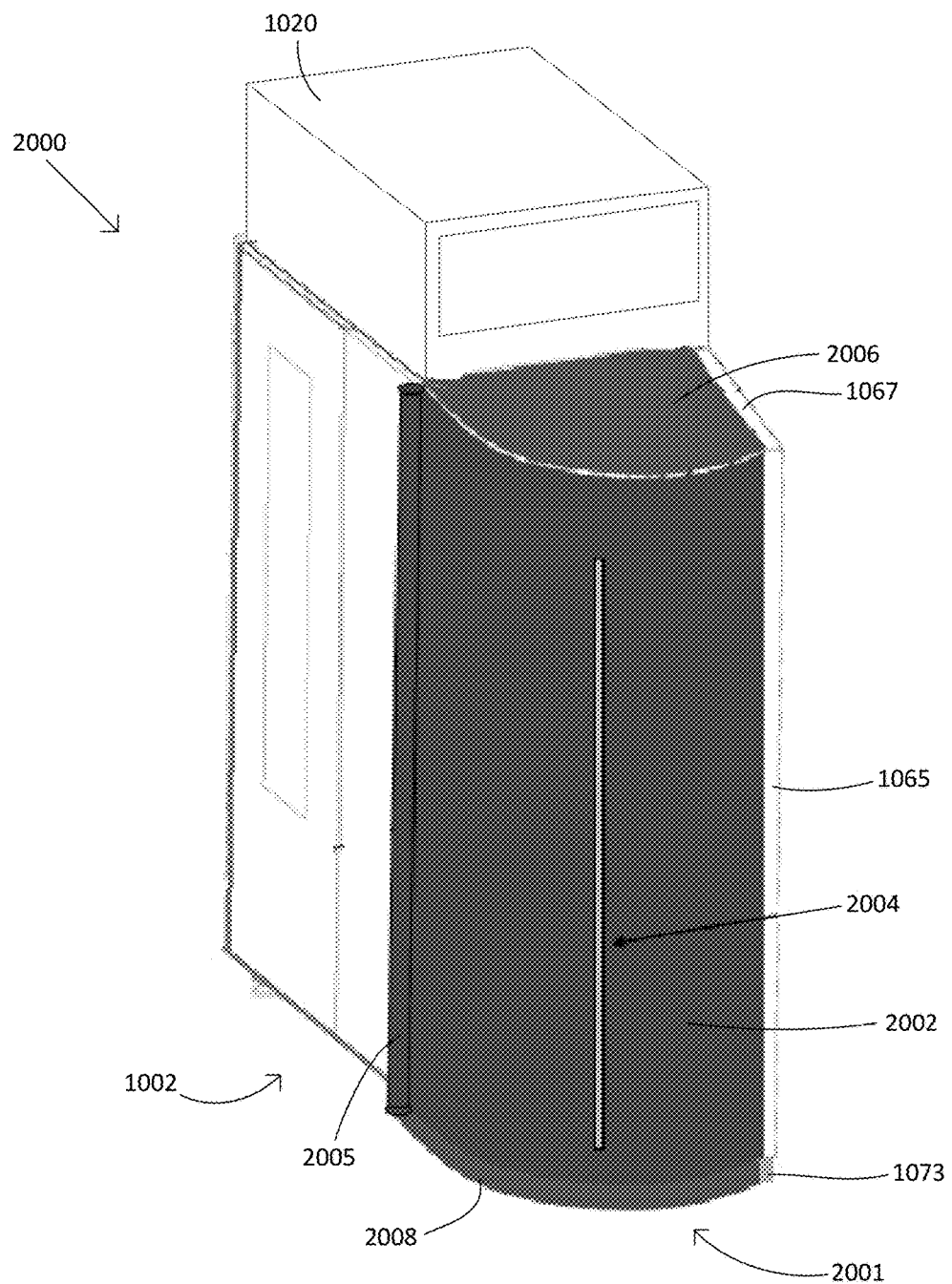
FIG. 7 is a perspective view of a data storage library and deployed barrier in accordance with one aspect.

Referring to FIG. 7, a service access system 2000 in accordance with an aspect of the present disclosure is illustrated. Service access system 2000 comprises a flexible barrier 2001 configured to substantially surround an opening formed by open door 1065 of a data storage library frame 1002. While FIG. 7 only shows library frame 1002 comprising a single library frame, it is to be understood that library frame 1002 may comprise a plurality of frames, such as that which is illustrated in FIGS. 1A-1B. Library frame(s) 1002 may comprise conventional data storage library componentry, similar to that which is found in library 10 described above with respect to FIG. 2. For instance, one or more of library frames 1002 may comprise a plurality of storage slots to hold data storage cartridges associated with data storage media, one or more data storage drives to read and/or write data associated with the media associated with the data storage cartridges, and one or more robotic accessors. Furthermore, data storage library frame(s) 1002 comprises one or more environmental conditioning units within an enclosure 1020, such as that which is described above with respect to data storage library 10 in FIG. 1B and 1004 in FIG. 5. The environmental conditioning unit(s) may control one or more environmental conditions (e.g., temperature and/or humidity) within the library frame(s) 1002. In one embodiment, it is contemplated that the data storage library will be a tape library which may include tape cartridges, tape drives, and accessors. However, the data storage library may be any storage or information technology equipment which requires a maintained environment therein, such as data center server racks, etc.

As noted above, service access system 2000 comprises a barrier 2001 adapted and configured to substantially and/or entirely surround the access opening of data storage library frame(s) 1002, which preferably permits access to the data storage library in a manner that separates, insulates, and/or isolates environmental conditions from exterior of the data storage library from intruding the data storage library during access (e.g., to insert or remove media, for a service and/or maintenance procedure, etc.) while also providing an accessible work space when door 1065 is opened. As shown in FIG. 7, barrier 2001 is mounted between door 1065 and bottom frame portion 1068, top frame portion 1069, and side frame portion 1070 of frame 1002 so as to substantially surround the access opening of frame 1002 when door 1065 is opened. Barrier 2001 may comprise a sidewall portion 2002 made of a flexible material, such as nylon, polyester, canvas, cotton, silk, plastic, foil, or any other suitable material, for example, a substantially non-porous material capable of resisting or impeding exterior environmental conditions from intruding into the interior of the chamber formed by the barrier 2001. Alternatively, sidewall portion 2002 may be formed of a semi-rigid or rigid material, such as plastic, metal, reinforced fabric, carbon fiber, etc. Furthermore, barrier 2001 may comprise multiple layers and/or multiple different materials so as to provide various insulating properties, waterproofness, etc.

Barrier 2001 further includes a top portion 2006 and bottom skirt portion 2008. Top portion 2006 and bottom skirt portion 2008 may be formed of the same material as sidewall portion 2002. However, even if sidewall portion 2002 is formed of a flexible material, one or both of top portion 2006 and bottom skirt portion 2008 may be formed of a more rigid material, as there may be additional space above and below library frame 1002 for storage of such rigid structures, as will be further detailed below.

One side of sidewall portion 2002 may be coupled to the unhinged open end of door 1065, while the other side of sidewall portion 2002 may be coupled to a retracting barrier storage mechanism 2005, which may be affixed at or near the side frame portion 1070 of frame 1002. Barrier storage mechanism 2005 may operate similar to a retractable window shade mechanism, wherein the sidewall portion 2002 of barrier 2001 may be compactly rolled within barrier storage mechanism 2005 when door 1065 is closed. However, when door 1065 is opened, sidewall portion 2002 may be extended and/or deployed from barrier storage mechanism 2005 so as to form a work space and/or chamber in the area between sidewall portion 2002 and the access opening of library frame 1002, thereby increasing the volumetric space inside the barrier system enclosure to work on the data storage library while protecting the library's interior environment. While barrier storage mechanism 2005 is shown as mounted at or near the side frame portion 1070 of single frame 1002, it is to be understood that barrier storage mechanism 2005 may be mounted elsewhere on the data storage library. For example, if frame 1002 is not a single frame or an end frame in a multi-frame data storage library, barrier store mechanism 2005 may be located between adjacent frames in the multi-frame data storage library. In another example, barrier store mechanism 2005 may be located at door 1065 or there may not be a barrier store mechanism 2005. Herein, barrier store, barrier store mechanism, and barrier storage mechanism may all refer to the same component or mechanism.

Bottom skirt portion 2008, which extends along the bottom portion of barrier 2001, may aid in preventing air from entering or escaping in the gap formed between the sidewall portion 2002 and the floor of the room (e.g., the data center) when door 1065 is opened. In one aspect, bottom skirt portion 2008 may be formed of a rigid or semi-rigid material and may slide below frame 1002 (i.e., in gap 1071 shown in FIG. 6) when door 1065 is closed. Alternatively, in accordance with another aspect, bottom skirt portion 2008 may be integrated into the material which forms sidewall portion 2002. In such a configuration, barrier storage mechanism 2005 may extend to the floor of the room, as opposed to only to the bottom surface of the frame 1002.

In addition to bottom skirt portion 2008, a door sweep or door skirt 1073 may be attached along the length of bottom frame portion 1066 of door 1065. Similar to bottom skirt portion 2008, door skirt 1073 may aid in preventing air from entering or escaping below a gap between bottom frame portion 1066 and the floor. Door skirt 1073 may be formed of any appropriate material, including flexible, semi-rigid, or rigid materials. Herein, door skirt 1073 may comprise anything that provides a partial or full environmental seal between the bottom of a door 1065 and the floor upon which the library rests (e.g., a skirt, door sweep, hanging flap(s), hanging slot(s), air curtain, etc.). Furthermore, while not shown, a skirt similar to door skirt 1073 may also be disposed below the access opening of frame 1002 when barrier 2001 is in place so as to block air from entering or exiting the chamber formed by the barrier through gap 1071 located below frame 1002.

Top portion 2006 of barrier 2001 may extend from the top frame portion 1069 (shown in FIG. 6) of library frame 1002 to top door frame portion 1067 when door 1065 is opened. Top portion 2006 of barrier 2001 may be formed of any appropriate material. In one aspect, top portion 2006 may be formed of a semi-rigid material which pivots about the same axis as door 1065 when door 1065 is opened and closed. When door 1065 is closed, top portion 2006 may be stored within the interior of frame 1002 or, alternatively, top portion may be stored outside of frame 1002, such as between enclosure 1020 and frame 1002. Additionally and/or alternatively, top portion 2006 may be formed of a flexible or substantially flexible material which collapses when door 1065 is closed and opens when door 1065 is opened.

Sidewall portion 2002 may further comprise one or more access ports 2004. While shown as running vertically along a middle section of sidewall portion 2002, it is to be understood that access port 2004 may be located anywhere along sidewall portion 2002, and may also be configured non-vertically (e.g., diagonally or horizontally). Access port 2004 may include one or more doors, hanging panels, sliding panels, hinged panels, flaps, curtains, hanging slats, split membrane, air curtains, or any other suitable device or method of inhibiting, resisting, and/or preventing environmental contamination between separate spaces. In one aspect, the environmental access barrier substantially seals access port 2004 before and/or after entry of a technician or other personnel within barrier 2001. The access port 2004 may be closed via, for example, one or more zippers or other suitable closure mechanisms.

Additionally, and/or alternatively, to accessing the interior of frame 1002 via access port 2004, access may be gained by temporarily detaching (and then reattaching) barrier store mechanism 2005 from frame 1002, or by temporarily detaching (and then reattaching) sidewall portion 2002 from barrier store mechanism 2005. Similarly, access may be gained by temporarily detaching (and then reattaching) sidewall portion 2002 from door 1065.

By providing barrier 2001 having an access port 2004, a technician or other personnel may open door 1065 and enter the conditioned environment of the data storage library to access user interfaces of the library, bulk load data storage cartridges, service the library (e.g., replace defective components, add optional components, etc.), or for any other reason while substantially inhibiting an influx of external air into (or escape of conditioned air out of) the data storage library. In this way for example, warm, humid air from outside the data storage library may be inhibited or prevented from entering the interior portions of the data storage library, thereby inhibiting, impeding or preventing the formation of condensation on components therein.

While FIG. 7 shows that barrier 2001 may be automatically deployed when door 1065 is opened, it is to be understood that, in accordance with an alternative aspect of the disclosure, barrier 2001 may itself be the door to the frame 1002. Thus, the technician or other personnel entering the interior of the data storage library would need only operate the barrier 2001 in order to gain access into the interior of the data storage library.

Figure 8:
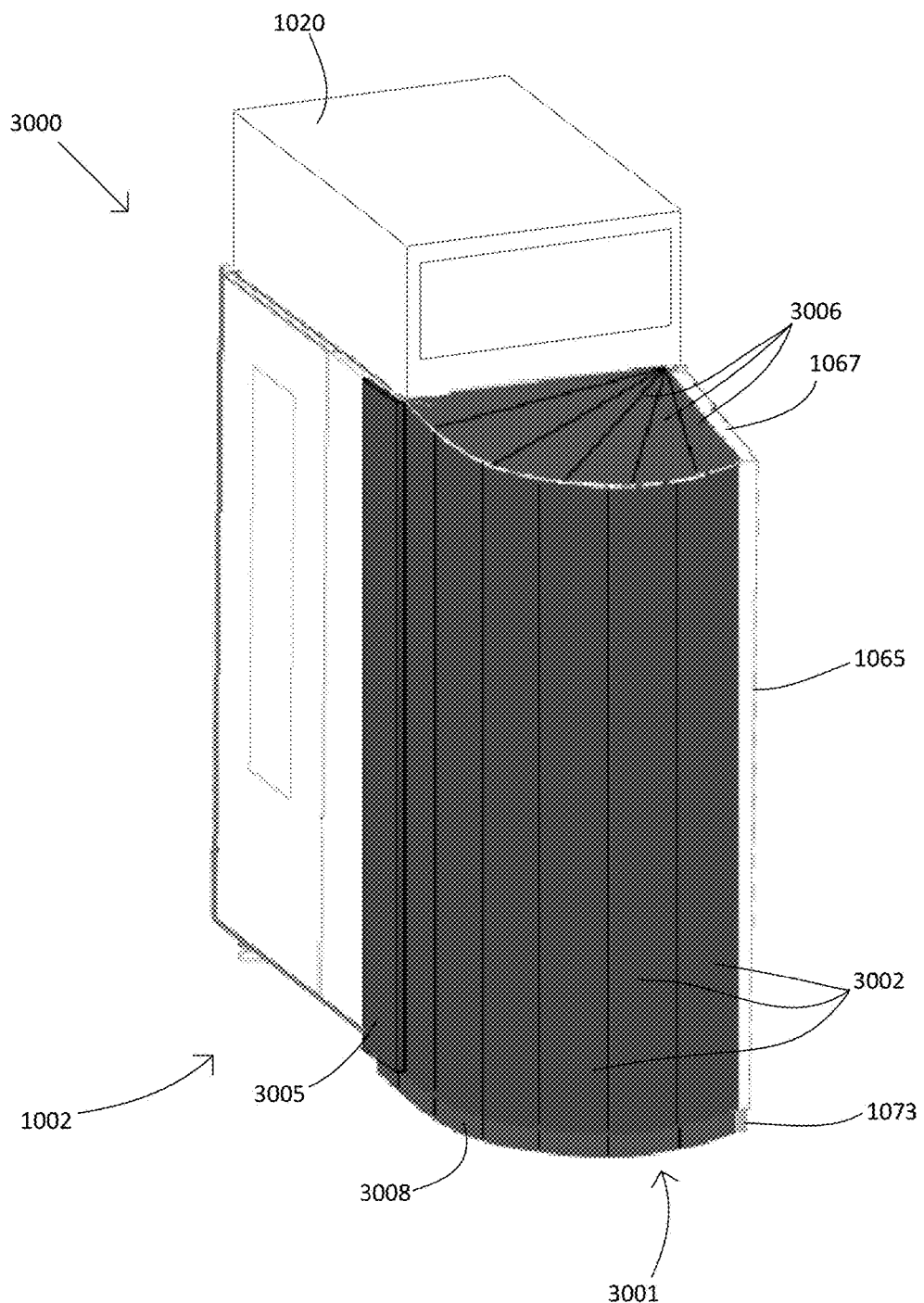
FIG. 8 is a perspective view of a data storage library and deployed barrier in accordance with another aspect.

Next, referring to FIG. 8, service access system 3000 according to another aspect of the disclosure is illustrated. System 3000 comprises a barrier 3001 adapted and configured to substantially and/or entirely surround the access opening of data storage library frame(s) 1002, which preferably permits access to the data storage library in a manner that separates, insulates, and/or isolates environmental conditions from exterior of the data storage library from intruding the data storage library during a service and/or maintenance procedure, while also providing an accessible work space when door 1065 is opened.

As shown in FIG. 8, barrier 3001, like barrier 2001, may be mounted between door 1065 and bottom frame portion 1068, top frame portion 1069, and side frame portion 1070 of frame 1002 so as to substantially surround the access opening of frame 1002 when door 1065 is opened. However, unlike barrier 2001, various components of barrier 3001 may be formed of a plurality of overlapping, sliding panels, similar to those found in an airport luggage carousel. Specifically, barrier 2001 may comprise a plurality of overlapping side panels 3002, overlapping skirt panels 3008, and overlapping top panels 3006. When door 1065 is closed, side panels 3002 and/or skirt panels 3008 may be housed in a stacked formation within a barrier storage mechanism 3005. On the other hand, when door 1065 is opened, the overlapping panels may extend so as to form an environmentally-protected work space around the access opening of frame 1002. Side panels 3002, skirt panels 3008, and top panels 3006 may be formed of the same or different materials.

While not shown, side panels 3002 may include an access port or, alternatively and/or additionally, access may be gained into frame 1002 by disconnecting (and then reconnecting) one or more side panels from the barrier store 3005 and/or the door 1065, and/or disconnecting (and then reconnecting) the barrier store from the frame 1002. It is to be understood that barrier storage mechanism 3005 may be located elsewhere (e.g., at door 1065) or there may not be a barrier store mechanism 3005.

Figure 9:
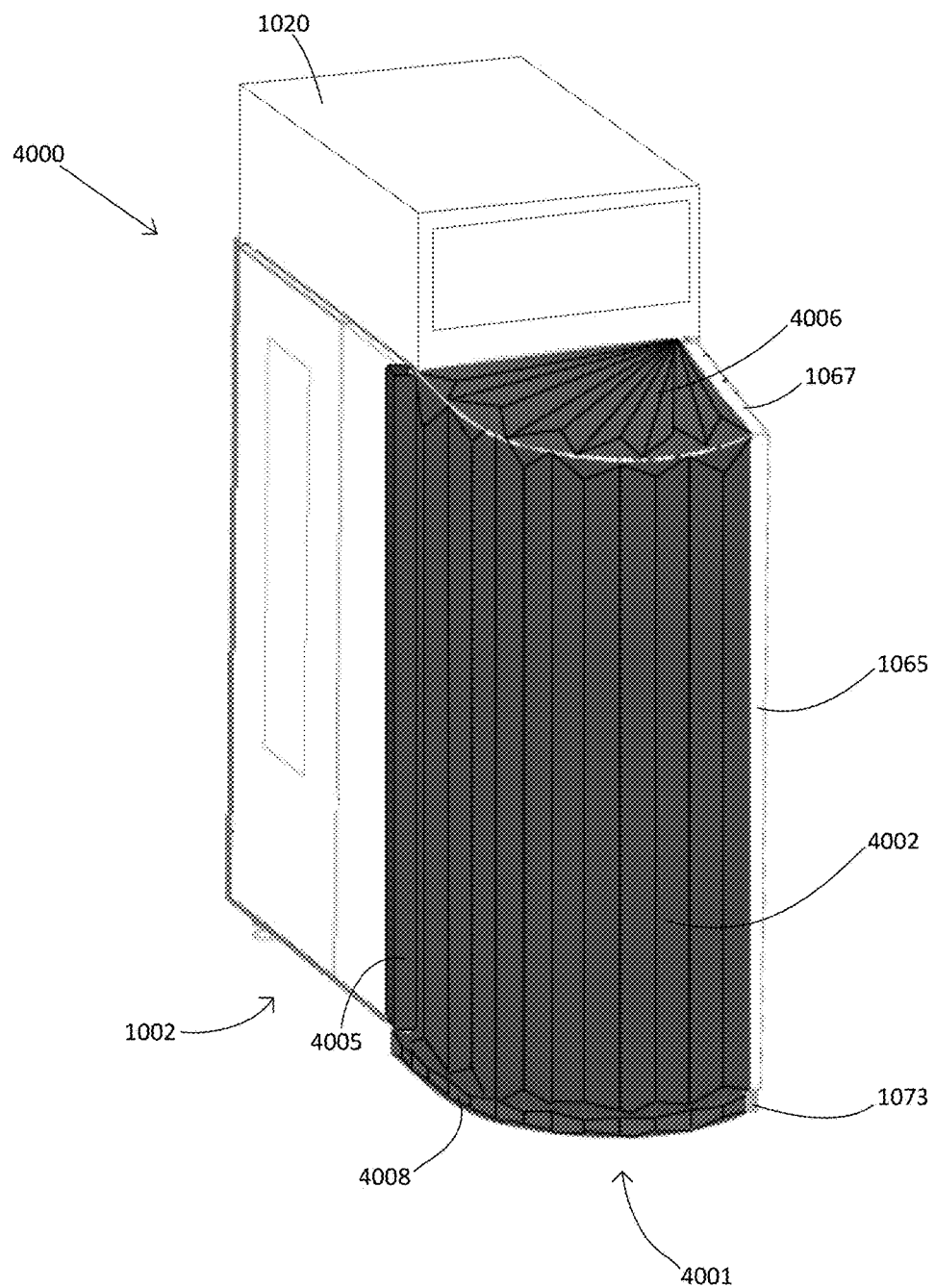
FIG. 9 is a perspective view of a data storage library and deployed barrier in accordance with another aspect.

Referring now to FIG. 9, a service access system 4000 in accordance with another aspect of the disclosure is illustrated. System 4000 comprises a barrier 4001 adapted and configured to substantially and/or entirely surround the access opening of data storage library frame(s) 1002, which preferably permits access to the data storage library in a manner that separates, insulates, and/or isolates environmental conditions from exterior of the data storage library from intruding the data storage library during a service and/or maintenance procedure, while also providing an accessible work space when door 1065 is opened.

As shown in FIG. 9, barrier 4001, like barriers 2001 and 3001, may be mounted between door 1065 and bottom frame portion 1068, top frame portion 1069, and side frame portion 1070 of frame 1002 so as to substantially surround the access opening of frame 1002 when door 1065 is opened. However, unlike barriers 2001 and 3001, various components of barrier 4001 may be formed of a folded panel, similar to those found in an accordion. Specifically, barrier 4001 may include one or more foldable side panels 4002, foldable skirt panels 4008, and foldable top panels 4006. When door 1065 is closed, side panel(s) 4002 and/or skirt panel(s) 4008 may be housed in a folded, stacked formation within a barrier storage mechanism 4005. On the other hand, when door 1065 is opened, the panel(s) may extend so as to form an environmentally-protected work space around the access opening of frame 1002. Side panel(s) 4002, skirt panel(s) 4008, and top panel(s) 4006 may be formed of the same or different materials. Furthermore, foldable top panel(s) 4006 may be stored within the interior of frame 1002 or, alternatively, foldable top panel(s) 4006 may be stored outside of frame 1002, such as between enclosure 1020 and frame 1002. Herein, a folded panel may comprise a single folded panel, a stack of folded panels, a series of connected panels that provide folds, or any other method of providing a compressible barrier comprising folding.

While not shown, side panels 4002 may include an access port for access through barrier 4001 or, alternatively and/or additionally, access may be gained into frame 1002 by disconnecting (and then reconnecting) one or more side panels from the barrier store mechanism 4005 and/or the door 1065, and/or disconnecting (and then reconnecting) the barrier store mechanism 4005 from the frame 1002. It is to be understood that barrier store mechanism 4005 may be located elsewhere (e.g., at door 1065) or there may not be a barrier store mechanism 4005.

Figure 10:
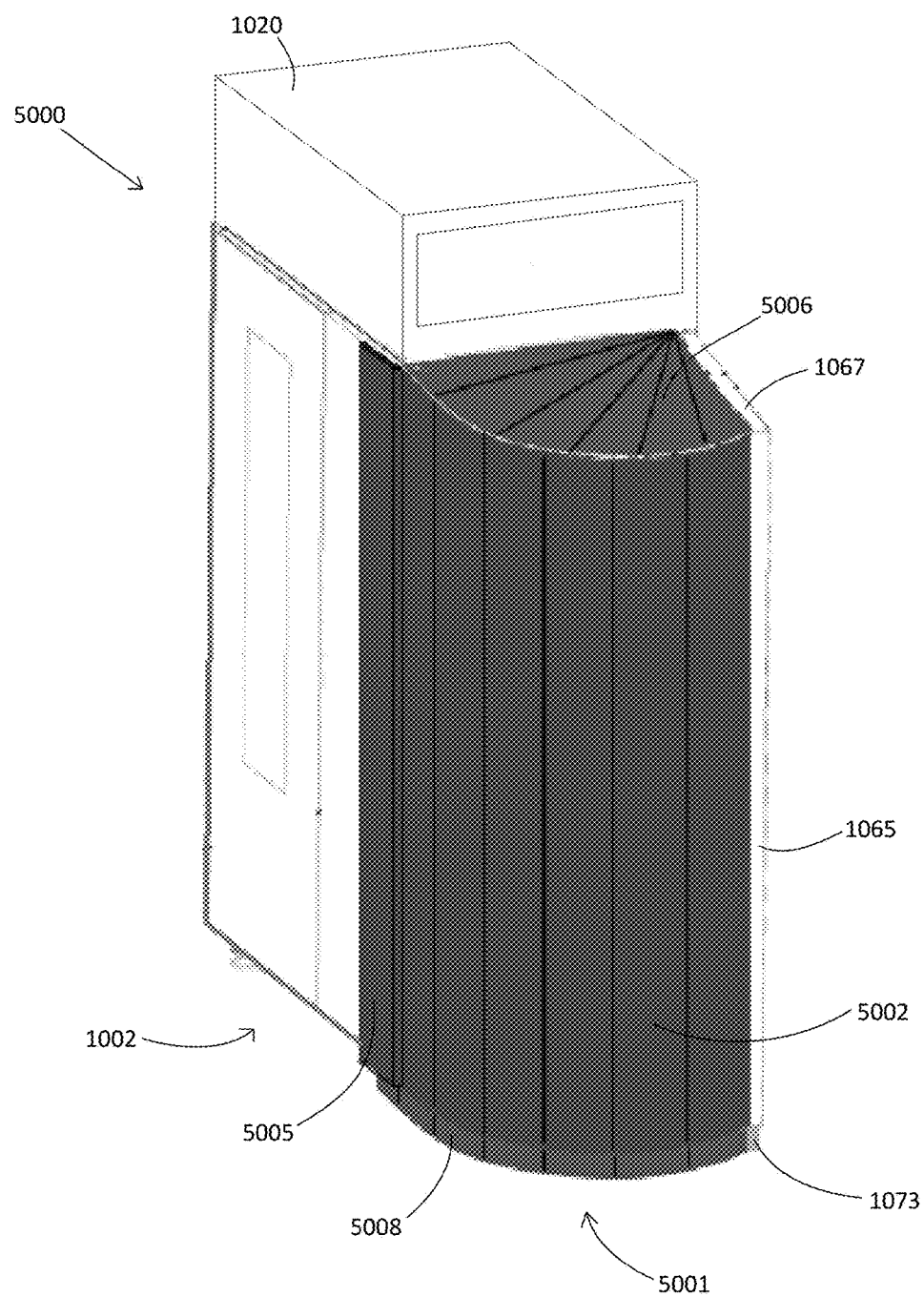
FIG. 10 is a perspective view of a data storage library and deployed barrier in accordance with another aspect.

Next, referring to FIG. 10, a service access system 5000 in accordance with another aspect of the disclosure is illustrated. System 5000 comprises a barrier 5001 adapted and configured to substantially and/or entirely surround the access opening of data storage library frame(s) 1002, which preferably permits access to the data storage library in a manner that separates, insulates, and/or isolates environmental conditions from exterior of the data storage library from intruding the data storage library during a service and/or maintenance procedure, while also providing an accessible work space when door 1065 is opened.

As shown in FIG. 10, barrier 5001, like barriers 2001, 3001, and 4001, may be mounted between door 1065 and bottom frame portion 1068, top frame portion 1069, and side frame portion 1070 of frame 1002 so as to substantially surround the access opening of frame 1002 when door 1065 is opened. However, unlike barriers 2001, 3001, and 4001, various components of barrier 5001 may be formed as hanging slats or flaps, similar to those found in vertical window blinds, or those found in cold-storage areas. Specifically, barrier 5001 may include a plurality of hanging panels 5002, hanging skirt panels 5008, and hanging top panels 5006. In the case of hanging top panels 5006, each end of top panels 5006 may be anchored and/or the panels 5006 may be formed of a sufficiently rigid material to prevent the panels from drooping when barrier 5001 is deployed. Alternatively, top panels 5006 and/or skirt panels 5008 may be formed similarly to overlapping top panels 3006 and/or overlapping skirt panels 3008, as described above with respect to FIG. 8. Still further, top panels 5006 and/or skirt panels 5008 may be formed similarly to foldable skirt panels 4008, and foldable top panels 4006, as described above with respect to FIG. 9. Hanging panels 5002, may extend all the way to the floor, thereby eliminating the need for skirt panels 5008. Side panels 5002, skirt panels 5008, and top panels 5006 may be formed of the same or different materials.

When door 1065 is closed, side panels 5002 and/or skirt panels 5008 may be housed in a folded, stacked formation within a barrier storage mechanism 5005. On the other hand, when door 1065 is opened, the hanging panels may extend so as to form an environmentally-protected work space around the access opening of frame 1002. Barrier 5001 does not necessarily need to be fully sealed, as hanging panels 5002 may be sufficient to impede exterior environmental conditions from intruding into the chamber formed by the hanging panels and/or substantially maintain the environment within the data storage library while door 1065 is opened, even if small amounts of external air are allowed to enter the chamber formed by the hanging panels and/or the data storage library, and/or small amounts of internal air are allowed to escape. In one aspect, the environmental conditioning unit may be configured to overcome any such minimal losses due to this minor leakage.

While not shown, access may be gained into frame 1002 by simply separating adjacent hanging side panels 5002. The hanging side panels 5002 should naturally return to a "closed" position after entry (or exit) of a technician within the work space.

Additionally, it is to be understood that any features of the embodiments shown and described with respect to FIGS. 7-10 may be interchanged and/or combined. For example, barrier store mechanism 2005 shown in FIG. 7 may be utilized with skirt panels 3008 shown in FIG. 8 and top panels 4006 shown in FIG. 9. Other configurations and combinations are contemplated.

Furthermore, certain features of the barrier may be omitted without unduly effecting the performance of the overall system. For example, in some embodiments, skirts 2008, 3008, 4008, and/or 5008 may be omitted. Also, in some embodiments, top panels 2006, 3006, 4006, and/or 5006 may be omitted. Door skirt 1073 may also be omitted. In such embodiments, the environmental conditioning unit(s) may provide sufficient temperature regulation and/or positive air pressure so as to overcome any losses due to the omitted barrier features. Likewise, door 1065 may not need to be opened for an extended period of time, thereby reducing any losses realized due to the omitted barrier features.

While the embodiments described above with respect to FIGS. 7-10 pertain to various barrier configurations in which the barrier is deployed (and undeployed) via the opening and closing of door 1065, it is to be understood that any of the barriers shown and described in FIGS. 7-10 may be attached (and, therefore, deployed) only after opening door 1065, and may similarly be removed prior to the closing of door 1065. In these embodiments, the barrier would not be automatically extended/deployed through the action of opening door 1065, and it would not automatically retract through the action of closing door 1065. Additionally, the barrier may be removed from door 1065 and/or frame 1002 when not in use. As such, as opposed to being a permanent or semi-permanent feature of the data storage library, the barrier may be a temporary device that is mounted and utilized only when access into the interior of the data storage library is needed. Furthermore, the barrier may be operated independently of door 1065. That is, the door may not automatically deploy the barrier upon opening. Instead, the technician may deploy the barrier in a separate step, after the door 1065 has already been opened. Likewise, the technician may retract and/or remove the barrier in a step prior to closing the door 1065. It will be appreciated that the barrier system is configured and adapted to be combinable with the data storage access door and the surrounding frame to provide an enclosure and/or chamber between the library access door and the library frame, and particularly the library access opening associated with the library access door, when the library access door is opened. The barrier system resists, impedes, inhibits and/or prevents environmental conditions from exterior of the data storage library from intruding into the chamber and/or interior of the data storage library. Alternatively or additionally, the barrier system resists, impedes, inhibits and/or prevents conditioned air from escaping to the exterior of the data storage library.

Next, processes for accessing a data storage library in a manner that inhibits, restricts and/or prevents environmental conditions exterior of the library from intruding into the interior of the library are disclosed, which may be useful, for example, when providing service within the data storage library. In one embodiment, a barrier is provided and erected to surround at least one access opening of a data storage library and provide an environmental blockade to inhibit, restrict, impede, and/or prevent environmental conditions exterior of the library from intruding into the interior of the library. The barrier preferably forms a work space which increases the volumetric capacity of conditioned space available for the technician to provide service within the data storage library.

Figure 11:
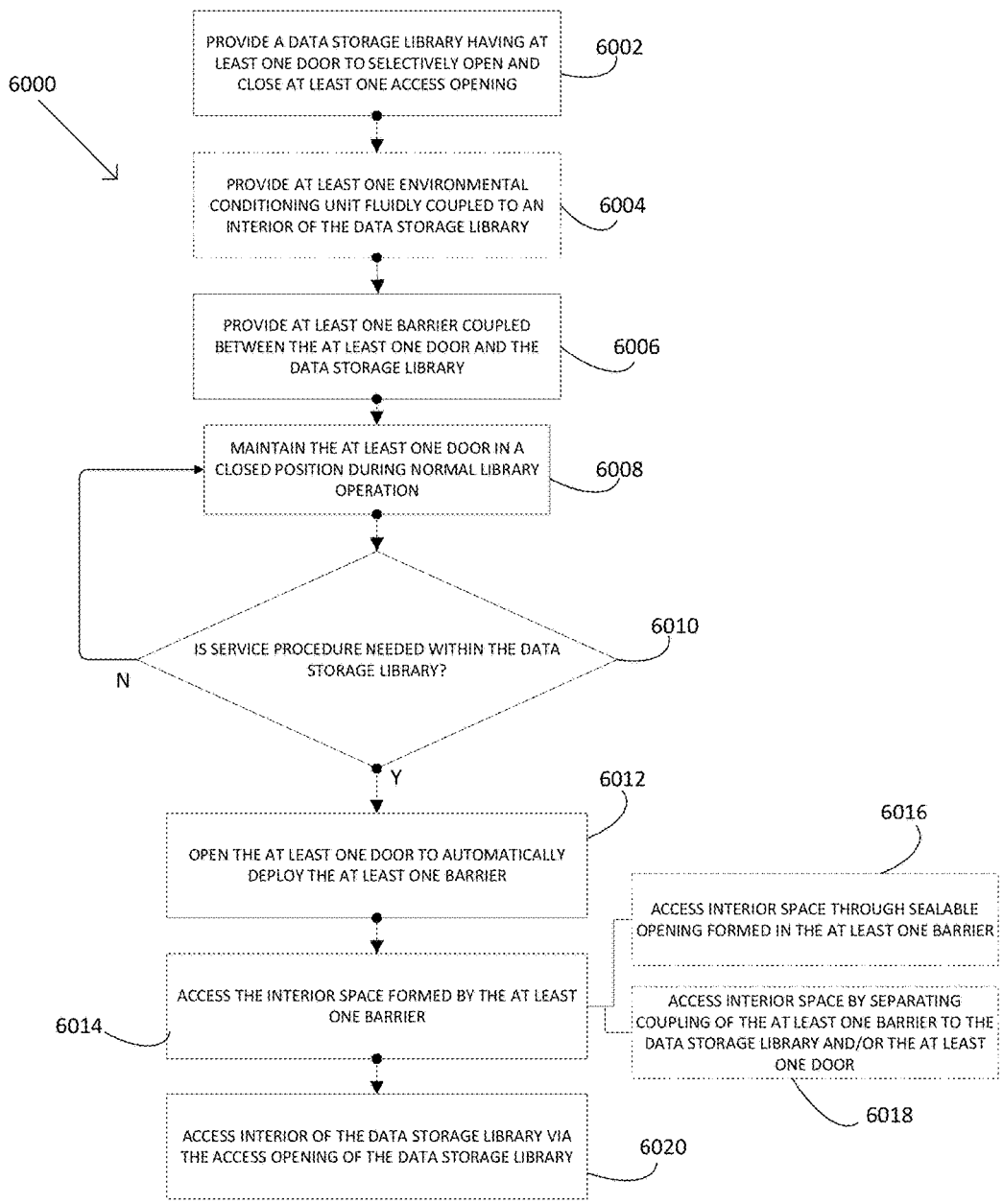
FIG. 11 is a flowchart of a method of accessing a data storage library to perform a service procedure within the data storage library in accordance with one aspect.

Referring to FIG. 11, a process 6000 for accessing a data storage library to perform a service procedure therein according to one embodiment is disclosed. While process 6000 may be considered for the sake of convenience and not with the intent of limiting the disclosure as comprising a series and/or number of steps, it is to be understood that the process does not need be performed as a series of steps and/or the steps do not need to be performed in the order shown and described with respect to FIG. 11, but may be performed as an integrated process, or a series of steps, in the order described or in an alternative order. It is to be understood that the library may be operational, partially operational, or fully operational during a service procedure. At 6002, a data storage library is provided, with the data storage library having at least one door capable of selectively opening and closing at least one access opening to the data storage library. As detailed above, the at least one door and the at least one access opening may be located on a front, rear, or side surface of the data storage library. At 6004, the data storage library may be provided with at least one environmental conditioning unit, which may be fluidly coupled to the interior of the data storage library so as to regulate and/or control one or more environmental conditions therein.

At 6006, at least one barrier is provided, with the at least one barrier coupled between the at least one door and the data storage library so as to form a work space that is substantially insulated and/or isolated from the outside environment. In one aspect the barrier resists, impedes, inhibits and/or prevents exterior environmental conditions, e.g. exterior air, from intruding into the workspace. The barrier preferably extends between the access door and the door frame of the data storage library. As detailed above, the at least one barrier may be coupled to the door such that opening of the door automatically deploys the at least one barrier, thereby increasing the volumetric work space available for a technician to perform a service procedure. However, at 6008, the at least one door is maintained in a closed position during normal library operation, thereby maintaining the at least one barrier in an undeployed and/or retracted position, as well.

At 6010, a determination is made whether or not a service procedure is needed within the data storage library. The determination may be made by a technician based on, for example, routine scheduled maintenance, repair, bulk load/unload of data storage cartridges, etc. or it may be made automatically by a library controller. If no, the at least one door is maintained in a closed position. However, if yes, the at least one door is opened, thereby automatically deploying the at least one barrier between the door and the data storage library, preferably the door frame opening at 6012. Alternatively, the barrier may be deployed manually. With the barrier deployed, the interior space formed by the at least one barrier may be accessed at 6014. For example, the interior of the barrier may be accessed by entering an opening formed on a side of the at least one barrier at 6016. The opening may have a door, flap, slats, split membrane, air curtain, zipper and/or other barrier or closure mechanism to close the opening. In one embodiment, the opening may be substantially sealable. Alternatively, and/or additionally, the interior of the barrier may be accessed by separating one or more coupling points of the at least one barrier to another location on the barrier, the data storage library and/or to the at least one door at 6018. The interior of the data storage library is accessed via the access opening of the at least one data storage library at 6020, thereby enabling a service and/or maintenance procedure to be performed within the data storage library while minimizing and/or preventing the intrusion of unconditioned air from the external environment (e.g., the data center) into the data storage library.

Figure 12:
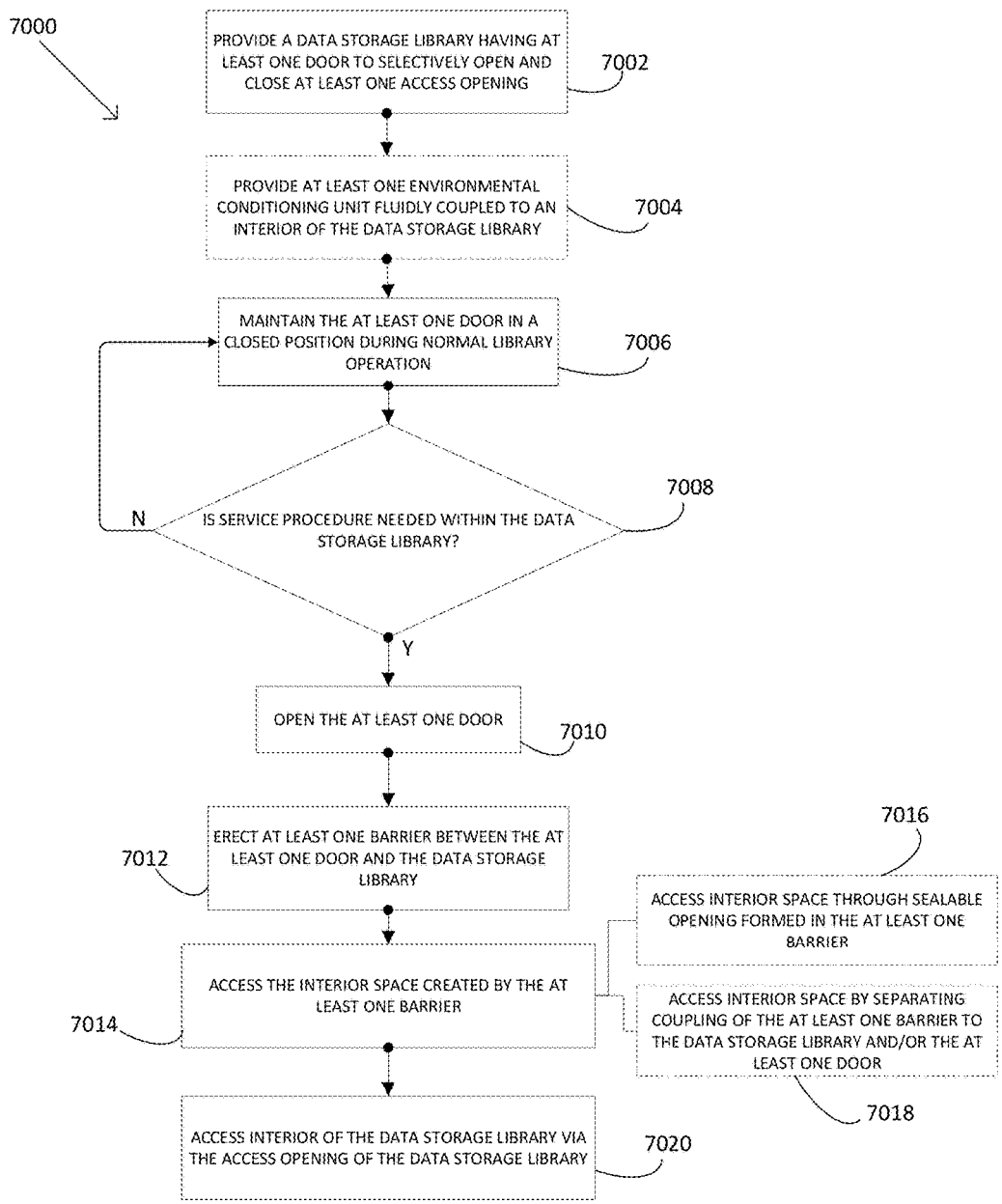
FIG. 12 is a flowchart of a method of accessing a data storage library to perform a service procedure within the data storage library in accordance with another aspect.

Referring now to FIG. 12, a process 7000 for accessing the interior of a data storage library to perform a service procedure according to another embodiment is disclosed. While process 7000 may be considered for the sake of convenience and not with the intent of limiting the disclosure as comprising a series and/or number of steps, it is to be understood that the process does not need to be performed as a series of steps and/or the steps do not need to be performed in the order shown and described with respect to FIG. 12, but may be performed as an integrated process, or a series of steps, in the order described or in an alternative order. It is to understood that the library may be operational, partially operational, or fully operational during the service procedure. At 7002, a data storage library is provided, with the data storage library having at least one door capable of selectively opening and closing at least one access opening to the data storage library. As detailed above, the at least one door and the at least one access opening may be located on a front, rear, or side surface of the data storage library. At 7004, the data storage library may be provided with at least one environmental conditioning unit, which may be fluidly coupled to the interior of the data storage library so as to regulate one or more environmental conditions therein. At 7006, the at least one door is maintained in a closed position during normal library operation, thereby substantially preventing environmental conditions from outside the data storage library from entering the interior of the data storage library.

At 7008, a determination is made whether or not a service procedure is needed within the data storage library. The determination may be made by a technician based on, for example, routine scheduled maintenance, repair, bulk load/unload of data storage cartridges, etc. or it may be made automatically by a library controller. If no, the at least one door is maintained in a closed position. However, if yes, the at least one door is opened at 7010. Then, at 7012, with the at least one door opened, at least one barrier is erected between the at least one door and the data storage library, preferably the frame of the data storage library opening, so as to form a work space that is substantially insulated and/or isolated from the outside environment. In one aspect, the barrier resists, impedes, inhibits, and/or prevents exterior environmental conditions, e.g., external air, from intruding into the workspace. The barrier preferably extends between the access door (the access door forming a portion of the barrier) and the door frame of the data storage library. As detailed above, the at least one barrier may be coupled between surfaces of the door and the data storage library so as to increase the volumetric work space available for a technician to perform a service procedure. With the barrier erected, the interior space formed by the at least one barrier may be accessed at 7014. For example, the interior of the barrier may be accessed by entering an opening formed on a side of the at least one barrier at 7016. The opening may have a door, flap, slats, and/or other barrier, or zipper and/or closure mechanism to close the opening. In one embodiment the opening may be substantially sealable. Alternatively and/or additionally, the interior of the barrier may be accessed by separating one or more coupling points of the at least one barrier to another location on the barrier, the data storage library and/or to the at least one door at 7018. Finally, the interior of the data storage library is accessed via the access opening of the at least one data storage library at 7020, thereby enabling bulk load/unload of data storage cartridges, a service and/or maintenance procedure, etc., to be performed within the data storage library while minimizing and/or preventing the intrusion of unconditioned air from the external environment (e.g., the data center) into the data storage library.

It follows that various embodiments described and/or suggested herein are able to provide data storage systems, and optionally, automated data storage libraries having environmental control capabilities associated with the automated data storage library, with at least one barrier system capable of providing an environmentally-controlled access point. As a result, favorable conditions (e.g., temperature, humidity, absence of contaminants, etc.) may be provided and/or substantially maintained for the data storage drives, data storage cartridges, and/or data storage media which may be stored in the library frame, even during service procedures in which the access door(s) or panel(s) of the library frame must be opened. Condensation formation and/or accumulation on the media (and its subsequent effect on contacting devices) may also be resisted, impeded, inhibited, and preferably avoided. Inhibiting and substantially avoiding the formation and accumulation of condensation and moisture may be particularly beneficial for tape libraries, tape cartridges and tape media.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A barrier system configured to at least partially surround at least one access opening that permits access to an interior of a data storage library, the at least one access opening having at least one door, the barrier system comprising:
   at least one side surface configured to be coupled to the at least one door at least partially along a first side surface location and to the data storage library along a second side surface location; and
   at least one top surface configured to be coupled to the at least one door at least partially along a first top surface location and to the data storage library along a second top surface location,
   wherein the at least one side surface and the at least one top surface of the barrier system are configured to be deployable to surround the at least one access opening and form a working space when the at least one door is in an open position, and are configurable to be collapsible when the at least one door is in a closed position, and further wherein the at least one side surface and the at least one top surface are configured to resist environmental conditions external to the data storage library from intruding into the working space when the at least one side surface and the at least one top surface are deployed.

2. The barrier system of claim 1, wherein the at least one side surface and the at least one top surface are configured to be automatically deployed when the at least one door is in the open position.

3. The barrier system of claim 1, wherein the barrier system is erected at least one of (1) prior to the at least one door being at least partially opened, and (2) after the at least one door is at least partially opened.

4. The barrier system of claim 1, further comprising at least one barrier access port in the at least one side surface to permit access to the working space and the interior of the data storage library.

5. The barrier system of claim 4, wherein the at least one barrier access port comprises at least one of the group consisting of one or more zippers, flaps, hanging slats, split membranes, air curtains, hinged doors, and combinations thereof.

6. The barrier system of claim 1, wherein the at least one side surface is formed of a flexible fabric material.

7. The barrier system of claim 6, wherein the at least one side surface is formed of at least one of the group consisting of a nylon, polyester, canvas, cotton, silk, plastic, foil, and combinations thereof.

8. The barrier system of claim 1, wherein the at least one side surface is formed of a plurality of overlapping panels.

9. The barrier system of claim 1, wherein the at least one side surface is formed of a folded panel.

10. The barrier system of claim 1, wherein the at least one side surface is formed of a plurality of hanging slats.

11. The barrier system of claim 1, further comprising a barrier storage mechanism, wherein the barrier storage mechanism is configured to store an undeployed, collapsible at least one side surface when the at least one door is in the closed position.

12. The barrier system of claim 1, further comprising a bottom skirt portion configured to extend below a lower portion of the at least one side surface when the at least one door is in the opened position.

13. The barrier system of claim 1, further comprising a door skirt configured to extend below a lower portion of the at least one door.

14. A barrier system configured to at least partially surround at least one access opening that permits access to an interior of a data storage library, the at least one access opening having at least one door, the barrier system comprising:
- at least one side surface configured to be coupled to the at least one door at a first side surface location and to the data storage library at a second side surface location, wherein a barrier storage mechanism is configured to be coupled to at least one of the data storage library and the at least one door at a location adjacent the at least one access opening and opposite a hinged connection location of the at least one door;
- wherein the at least one side surface of the barrier system is configured to automatically deploy when the at least one door is opened and is configured to automatically retract when the at least one door is closed, and further wherein the at least one side surface of the barrier system is configured to resist environmental conditions from exterior the data storage library from intruding into the interior of data storage library when the at least one side surface is deployed.

15. The barrier system of claim 14, further comprising at least one barrier access port in the at least one side surface to permit access to an interior of the barrier system and the interior of the data storage library.

16. The barrier system of claim 14, wherein the at least one side surface of the barrier system is formed of at least one of an air curtain, a flexible fabric material, a plurality of overlapping panels, a folded panel, and a plurality of hanging slats.

17. The barrier system of claim 14, further comprising at least one top surface configured to be coupled to the at least one door at a first top surface location and to the data storage library at a second top surface location.

18. A system comprising:
- a data storage library, wherein the data storage library is configured to read and receive media associated with one or more data storage cartridges, and further wherein the data storage library comprises at least one access opening for servicing an interior of the data storage library and at least one access door associated with the at least one access opening;
- at least one environmental conditioning unit configured to control at least one environmental condition within the data storage library; and
- at least one barrier configured to automatically deploy and surround the at least one access opening of the data storage library when the at least one access door is opened, and further wherein the at least one barrier is configured to resist environmental conditions external to the data storage library from intruding into the interior of the data storage library when the at least one access door is opened.

19. The system of claim 18, wherein the at least one barrier comprises at least one side surface, and further wherein the at least one side surface is formed of at least one of the group consisting of a flexible fabric material, a plurality of overlapping panels, a folded panel, a plurality of hanging slats, and combinations thereof.

20. The system of claim 19, further comprising a barrier storage mechanism, wherein the barrier storage mechanism is configured to store the at least one side surface of the at least one barrier when the at least one access door is closed.

* * * * *